United States Patent
Tekumalla et al.

(10) Patent No.: US 8,645,778 B2
(45) Date of Patent: Feb. 4, 2014

(54) SCAN TEST CIRCUITRY WITH DELAY DEFECT BYPASS FUNCTIONALITY

(75) Inventors: Ramesh C. Tekumalla, Breinigsville, PA (US); Prakash Krishnamoorthy, Bethlehem, PA (US)

(73) Assignee: LSI Corporation, San Jose, CA (US)

(*) Notice: Subject to any disclaimer, the term of this patent is extended or adjusted under 35 U.S.C. 154(b) by 115 days.

(21) Appl. No.: 13/341,998

(22) Filed: Dec. 31, 2011

(65) Prior Publication Data

US 2013/0173976 A1 Jul. 4, 2013

(51) Int. Cl.
*G01R 31/28* (2006.01)

(52) U.S. Cl.
USPC .......................................................... 714/726

(58) Field of Classification Search
USPC .................................................. 714/726, 727
See application file for complete search history.

(56) References Cited

U.S. PATENT DOCUMENTS

| | | | |
|---|---|---|---|
| 5,390,190 A | 2/1995 | Nanda et al. | |
| 5,477,545 A | 12/1995 | Huang | |
| 5,881,067 A | 3/1999 | Narayanan et al. | |
| 5,909,451 A | 6/1999 | Lach et al. | |
| 6,243,665 B1 | 6/2001 | Nagoya et al. | |
| 6,490,702 B1 * | 12/2002 | Song et al. | 714/726 |
| 6,996,759 B2 * | 2/2006 | Price | 714/726 |
| 7,129,762 B1 | 10/2006 | Vadi | |
| 7,231,563 B2 * | 6/2007 | Vinke et al. | 714/718 |
| 7,237,164 B1 * | 6/2007 | Katchmart | 714/726 |
| 7,246,282 B2 | 7/2007 | Chau et al. | |
| 7,373,568 B1 | 5/2008 | Horovitz | |
| 7,380,183 B2 * | 5/2008 | Machimura | 714/726 |
| 7,607,059 B2 * | 10/2009 | Osanai | 714/729 |
| 7,613,967 B1 | 11/2009 | Tan | |
| 7,617,425 B2 * | 11/2009 | Nadeau-Dostie et al. | 714/719 |
| 7,831,876 B2 | 11/2010 | Goyal et al. | |
| 7,949,916 B1 * | 5/2011 | Ang | 714/726 |
| 8,301,414 B2 * | 10/2012 | Cheng et al. | 702/185 |

(Continued)

FOREIGN PATENT DOCUMENTS

| | | |
|---|---|---|
| EP | 1826579 A1 | 8/2007 |
| EP | 12188947 | 2/2013 |
| JP | 2008275480 A | 11/2008 |

OTHER PUBLICATIONS

Yu Huang, "Dynamic Learning Based Scan Chain Diagnosis," Design, Automation & Test in Europe Conference & Exhibition (DATE), Apr. 2007, pp. 1-6.

(Continued)

*Primary Examiner* — James C Kerveros
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises at least one scan chain having scan cells. The scan test circuitry further comprises scan delay defect bypass circuitry comprising multiplexers arranged within the scan chain. At least a given one of the multiplexers is configured to allow a corresponding one of the scan cells to be selectively bypassed in a scan shift configuration of the scan cells responsive to a delay defect associated with that scan cell. A delay defect bypass controller may be used to generate a bypass control signal for controlling the multiplexer between at least a first state in which the corresponding scan cell is not bypassed and a second state in which the corresponding scan cell is bypassed.

20 Claims, 5 Drawing Sheets

(56) References Cited

U.S. PATENT DOCUMENTS

| | | | |
|---|---|---|---|
| 2004/0098687 A1 | 5/2004 | Guettaf et al. |
| 2005/0055615 A1 | 3/2005 | Agashe et al. |
| 2005/0262409 A1 | 11/2005 | Wang et al. |
| 2006/0129900 A1 | 6/2006 | Clark |
| 2007/0186132 A1 | 8/2007 | Dingemanse |
| 2007/0245180 A1 | 10/2007 | Li |
| 2008/0126898 A1 | 5/2008 | Pandey |
| 2008/0133989 A1 | 6/2008 | Hayashi et al. |
| 2008/0288842 A1 | 11/2008 | Waayers et al. |
| 2010/0031101 A1 | 2/2010 | Kapur et al. |
| 2010/0188096 A1 | 7/2010 | Waayers et al. |
| 2012/0166860 A1 | 6/2012 | Khullar et al. |

OTHER PUBLICATIONS

James C.-M. Li, "Diagnosis of Multiple Hold-Time and Setup-Time Faults in Scan Chains," IEEE Transactions on Computers, Nov. 2005, pp. 1467-1472, vol. 54, No. 11.

Y. Huang et al., "Survey of Scan Chain Diagnosis," IEEE Design & Test of Computers, May-Jun. 2008, pp. 240-248, vol. 25, No. 3.

J-S. Yang et al., "Quick Scan Chain Diagnosis Using Signal Profiling," IEEE International Conference on Computer Design (ICCD): VLSI in Computers and Processors, Oct. 2005, pp. 157-160.

C.L. Kong et al., "Diagnosis of Multiple Scan Chain Faults," International Symposium for Testing and Failure Analysis (ISTFA), Oct. 2005, pp. 510-516.

M. Chen et al., "Diagnosing Scan Chain Timing Faults through Statistical Feature Analysis of Scan Images", Proc. Design Automation and Test in Europe, DATE 2011, 6 pages.

O. Sinanoglu et al., "Scan Chain Hold-Time Violations: Can They Be Tolerated?", IEEE Trans. on Very Large Scale Integration (VLSI), Jun. 2009, pp. 815-826, 2009, vol. 17, No. 6.

C.-W. Tzeng et al., "A Versatile Paradigm for Scan Chain Diagnosis of Complex Faults Using Signal Processing Techniques," ACM Trans. on Design Automation of Electronic Systems, Jan. 2008, 27 pages, vol. 13, No. 1.

I. Bayraktaroglu et al., "Test Volume and Application Time Reduction Through Scan Chain Concealment," Design Automation Conference, Jun. 2001, pp. 151-155.

Y. Bonhomme et al., "An Efficient Scan Tree Design for Test Time Reduction," Ninth IEEE European Test Symposium (ETS), May 2004, pp. 174-179.

Y. Cho et al., "On Reducing Test Application Time for Scan Circuits Using Limited Scan Operations and Transfer Sequences," IEEE Transactions on Computer-Aided Design of Integrated Circuits and Systems, Oct. 2005, pp. 1594-1605, vol. 24, No. 10.

O. Sinanoglu, "Construction of an Adaptive Scan Network for Test Time and Data Volume Reduction," Computers & Digital Techniques, Jan. 2008, pp. 12-22, vol. 2, No. 1.

P. Shanmugasundaram et al., "Dynamic Scan Clock Control for Test Time Reduction Maintaining Peak Power Limit," 29th IEEE VLSI Test Symposium (VTS), May 2011, pp. 248-253.

Hetherington et al., "Logic BIST for Large Industrial Designs; Real Issues and Case Studies," Proceedings of International Test Conference, Sep. 1999, pp. 358-367, New York, NY.

* cited by examiner

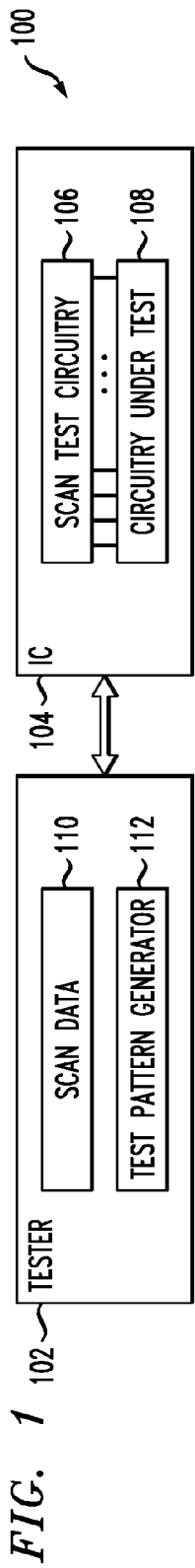
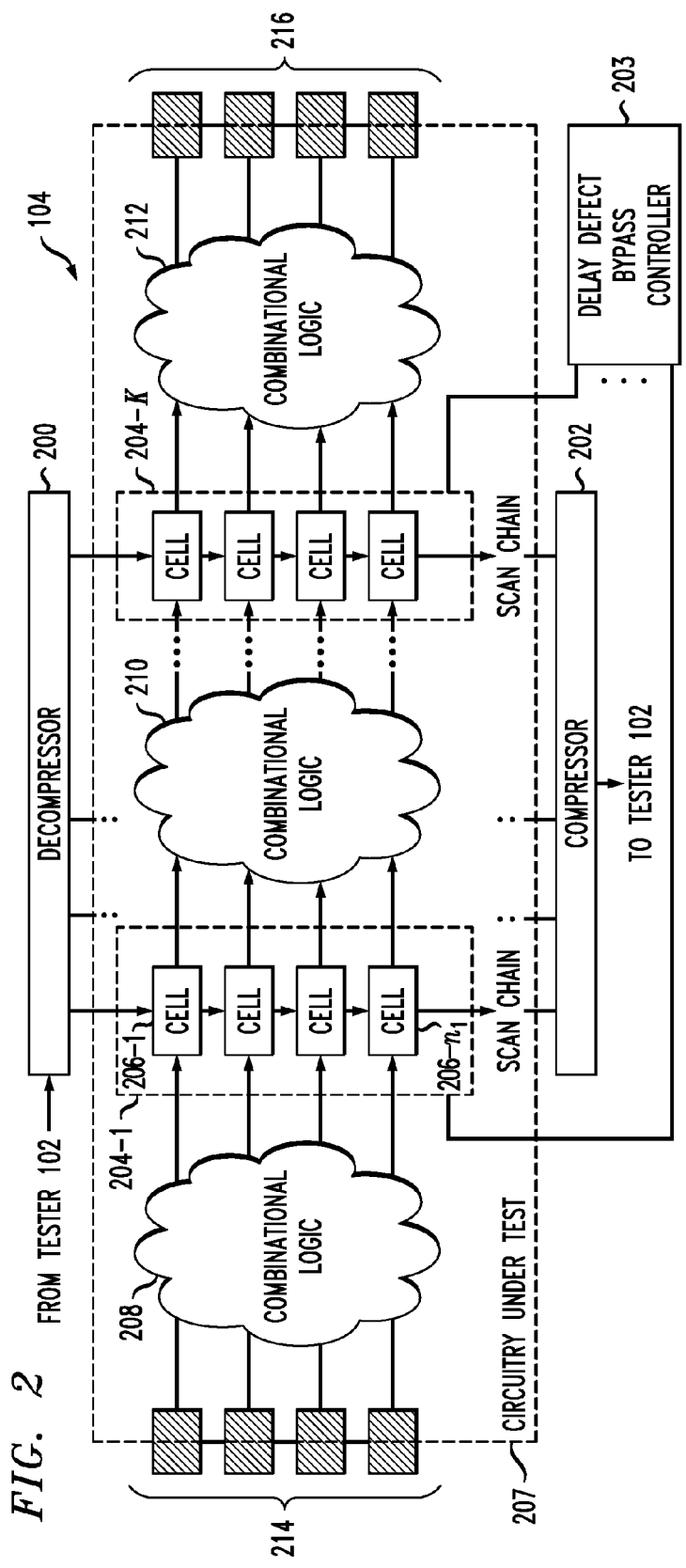

SCAN TEST CIRCUITRY WITH DELAY DEFECT BYPASS FUNCTIONALITY

BACKGROUND

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results. A given one of the flip-flops of the scan chain may be viewed as an example of what is more generally referred to herein as a "scan cell."

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. Additional details regarding compressed scan testing are disclosed in U.S. Pat. No. 7,831,876, entitled "Testing a Circuit with Compressed Scan Subsets," which is commonly assigned herewith and incorporated by reference herein.

Nonetheless, in both compressed and noncompressed scan testing, there remains a need for further improvements in scan testing performance. For example, conventional scan test circuitry is susceptible to scan delay defects that can interfere with the scan shift mode of operation. Timing paths between adjacent scan cells in the scan shift mode may comprise simple wire connections or could include more complex arrangements of logic circuitry such as multiple logic gates which become transparent in the scan shift mode. These timing paths must meet flip-flop setup and hold times and other timing requirements in order for the scan shift mode to work properly. However, even though the timing requirements may be met in a given integrated circuit design, there could be timing paths that are marginal in nature that barely meet the timing requirements.

When a design of the type described above is implemented in a physical integrated circuit, a small deviation from nominal manufacturing parameters can lead to delay defects in one or more of the marginal timing paths, causing the scan shift process to fail at the intended scan shift frequency. For example, the delay on the timing path between two adjacent scan cells may exceed the scan clock period, such that timing requirements for the path are violated, leading to a failure in the scan shift process.

SUMMARY

One or more illustrative embodiments of the invention provide scan delay defect bypass functionality that allows scan delay defects in an integrated circuit to be identified and bypassed in a scan shift mode of operation, thereby ensuring proper scan shifting even in the presence of marginal timing paths between adjacent scan cells.

In one embodiment, an integrated circuit comprises scan test circuitry and additional circuitry subject to testing utilizing the scan test circuitry. The scan test circuitry comprises at least one scan chain having a plurality of scan cells. The scan test circuitry further comprises scan delay defect bypass circuitry comprising a plurality of multiplexers arranged within said at least one scan chain. At least a given one of the multiplexers is configured to allow a corresponding one of the scan cells to be selectively bypassed in a scan shift configuration of the scan cells, responsive to a delay defect associated with that scan cell. A delay defect bypass controller may be used to generate a bypass control signal for controlling the multiplexer between at least a first state in which the corresponding scan cell is not bypassed and a second state in which the corresponding scan cell is bypassed.

BRIEF DESCRIPTION OF THE DRAWINGS

FIG. 1 is a block diagram showing an integrated circuit testing system comprising a tester and an integrated circuit under test in an illustrative embodiment.

FIG. 2 illustrates one example of the manner in which scan chains of scan test circuitry may be arranged between combinational logic in the integrated circuit of FIG. 1.

DETAILED DESCRIPTION

Figure 3:
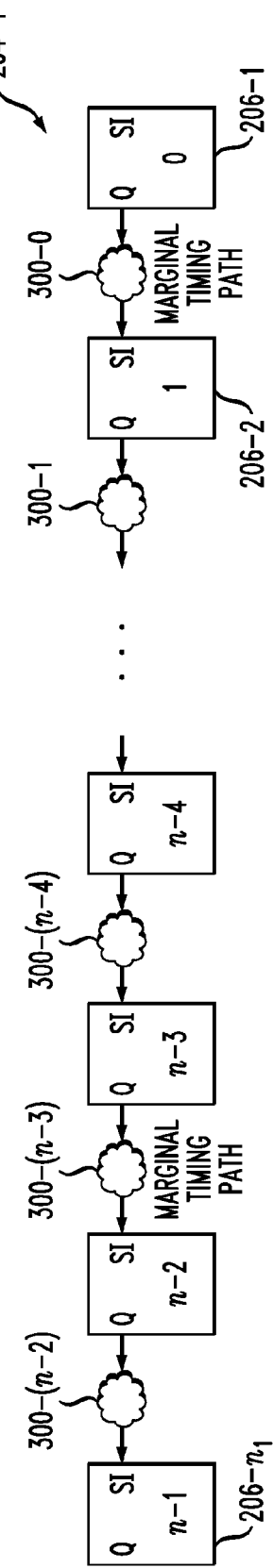
FIGS. 3 and 4 are more detailed views of one of the scan chains of FIG. 2 with and without scan delay defect bypass circuitry.

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved scan testing performance by selectively bypassing scan cells having associated delay defects during scan testing.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and embodiments of the invention are not limited in this regard. However, the illustrative embodiment shown in FIG. 2 will be described primarily in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, a delay defect bypass controller 203 and a plurality of scan chains 204-$k$, where $k=1, 2, \ldots K$.

Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104. The scan chains 204 may be associated with one or more distinct clock domains, or a single clock domain.

As will be described in greater detail below, the scan test circuitry 106 comprises scan delay defect bypass circuitry comprising a plurality of multiplexers arranged within at least one of the scan chains 204, with at least a given one of the multiplexers being configured to allow a corresponding one of the scan cells to be selectively bypassed in the scan shift mode of operation responsive to a delay defect associated with that scan cell. In the present embodiment, select states of the respective multiplexers of the scan delay defect bypass circuitry are controlled by the delay defect bypass controller 203. The scan delay defect bypass circuitry may be viewed as comprising at least a portion of the delay defect bypass controller 203. Additionally or alternatively, one or more portions of the delay defect bypass controller 203 may be implemented off-chip, such as within the tester 102.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift the desired set of scan test patterns into all of the scan chains. It may therefore be assumed without limitation that all of the scan chains 204 are of the same length n, such that $n_1=n_2=\ldots=n_k=n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift mode of operation. The compressor 202 of the scan test circuitry 106 receives scan test output data shifted out of the scan chains 204, also when such chains are configured as respective serial shift registers in the scan shift mode of operation, and compresses that scan test output data for delivery back to the tester 102.

Compressed scan input data is applied by tester 102 to M scan inputs of decompressor 200, and compressed scan output data is provided from compressor 202 back to tester 102 via M scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift mode of operation of the integrated circuit 104 and also to capture functional data from combinational logic elements in the functional mode of operation of the integrated circuit 104.

The number K of scan chains 204 is generally much larger than the number M of decompressor inputs or compressor outputs. The ratio of K to M provides a measure of the degree of scan test pattern compression provided in the scan test circuitry 106. It should be noted, however, that the number of compressor outputs need not be the same as the number of decompressor inputs. For example, there may be M decompressor inputs and P compressor outputs, where M≠P but both M and P are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in the above-cited U.S. Pat. No. 7,831,876. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern.

Embodiments of the invention are configured to permit particular scan cells in one or more of the scan chains 204 to be selectively bypassed during scan the scan shift mode of operation, in a manner that ensures proper scan shifting even in the presence of marginal timing paths between adjacent scan cells.

The scan test circuitry 106 provides this scan delay defect bypass functionality through the use of scan delay defect bypass circuitry illustratively comprising multiplexing circuitry arranged within the scan chains 204, as will be described below in conjunction with FIGS. 4, 5 and 6.

FIG. 3 shows one of the scan chains 204-1 of the scan test circuitry 106 of FIG. 2 without the inclusion of the above-noted multiplexing circuitry. The scan chain 204-1 includes $n_1$ scan cells 206, each illustratively comprising a single flip-flop, although in other embodiments scan cells may include multiple flip-flops, such as master and slave flip-flops, as well as other types and arrangements of logic circuitry. The scan cells 206 are indexed from 0 to n−1 in this figure, and this same indexing will be followed in FIGS. 4, 5 and 6. One or more of the other scan chains 204 may be configured in a similar manner.

Each of the scan cells 206 as shown has a scan input (SI) and a scan output (Q) as shown, although it may include other inputs and outputs, as will be appreciated by those skilled in the art. The scan output may also serve as a functional data output in the functional mode of operation, or the scan cell may provide a separate functional data output. It is to be appreciated, however, that embodiments of the invention are not limited in terms of the type of scan cells that are used in the scan chains.

In the scan shift mode of operation, the scan cells 206 of the scan chain 204-1 form a serial shift register in which the scan output of each scan cell other than a final scan cell of the scan chain is connected to a scan input of a subsequent one of the scan cells of the scan chain via a path 300 in the manner illustrated in FIG. 3. Thus, in this embodiment, the scan output of scan cell 0 is coupled to the scan input of scan cell 1 via a path 300-0, the scan output of scan cell 1 is coupled to the scan input of scan cell 2 via a path 300-1, and so on through the chain, with the scan output of scan cell n−2 being coupled to the scan input of the final scan cell n−1 via a path 300-(n−2). The paths 300 may comprise simple wire connections or more complex arrangements of logic circuitry. Such paths may be viewed as examples of what are more generally referred to herein as "timing paths" between adjacent scan cells.

In some embodiments, timing analysis is applied in designing the integrated circuit 104 in order to determine which of the paths 300 in the scan chain 204-1 are considered marginal timing paths in terms of meeting the timing requirements needed to ensure proper scan shifting.

By way of example, this timing analysis may involve analyzing the path delays of each timing path in the scan chain and determining an appropriate threshold value. The threshold may be used to partition a list of paths into those with timing slacks below the threshold and those with timing slacks equal to or above the threshold, with the timing slack being defined as the difference between the scan shift clock period and the critical delay for the path. Paths having timing slack values below the threshold are at risk of being adversely impacted by a delay defect that arises during manufacturing, in that if manufacturing variations cause the delay of such a path to exceed the clock period, resulting in a negative timing slack, the functionality of the scan chain is compromised.

As a more particular example, the threshold may be set to 20 picoseconds (ps), such that all paths having a timing slack below 20 ps are considered at risk of being affected by a delay defect. Other thresholds could be used, and will of course depend on scan clock frequency and other parameters of a given integrated circuit design.

In the FIG. 3 scan chain, it is assumed that at least the paths 300-0 and 300-(n−3) are identified as marginal timing paths that may be susceptible to scan delay defects when the integrated circuit 104 is manufactured. Accordingly, the scan cells associated with these marginal timing paths are configured for selective bypassing in the manner illustrated in FIG. 4 using scan delay defect bypass circuitry comprising a plurality of multiplexers 400. In this embodiment, the selective bypassing of the scan cells also involves bypassing substantially all of their respective corresponding marginal timing paths 300. As illustrated, the paths 300 may each comprise only a portion of the actual physical paths between the corresponding pairs of adjacent scan cells. The term "path" as used herein is therefore intended to be broadly construed, and should not be viewed as requiring particular portions of interconnection elements between a given pair of adjacent scan cells.

The multiplexers 400 are inserted at or near the scan inputs of the scan cells 206 that follow the respective scan cells and their associated marginal timing paths that are to be selectively bypassed. Thus, multiplexer 400-0 is inserted at or near the scan input of scan cell 1 to allow scan cell 0 and its marginal timing path 300-0 to be bypassed, and multiplexer 400-(n−3) is inserted at or near the scan input of scan cell n−2 to allow scan cell n−3 and its marginal timing path 300-(n−3) to be bypassed. Additional multiplexers may be inserted to allow bypassing of other scan cells and their associated paths in a similar manner. The portions of the respective timing paths that are bypassed may vary based upon placement of the corresponding multiplexers, as determined in accordance with a desired circuit layout and other factors in a given embodiment.

In this embodiment, each of the multiplexers 400 comprises a two-to-one multiplexer having a first input coupled to a scan input of the corresponding scan cell to be selectively bypassed, and a second input coupled to a scan output of the corresponding scan cell to be selectively bypassed. The output of each multiplexer is coupled to a scan input of a subsequent scan cell. Thus, for example, multiplexer 400-0 has a first input coupled to a scan input of scan cell 0, a second input coupled via the path 300-0 to a scan output of scan cell 0, and an output coupled to a scan input of scan cell 1. Similarly, multiplexer 400-(n−3) has a first input coupled to a scan input of scan cell n−3, a second input coupled via the path 300-(n−3) to a scan output of scan cell n−3, and an output coupled to a scan input of scan cell n−2.

Each of the multiplexers 400 further comprises a select line adapted for receiving a bypass control signal for controlling that multiplexer between at least a first state in which the corresponding scan cell is not bypassed and a second state in which the corresponding scan cell is bypassed. Thus, for example, select lines of the multiplexers 400-0 and 400-(n−3) in FIG. 4 are illustratively controlled by respective bypass control signals that are denoted bypass(0) and bypass(n−3). The bypass control signals in this embodiment are assumed to be generated by the delay defect bypass controller 203.

Figure 4:
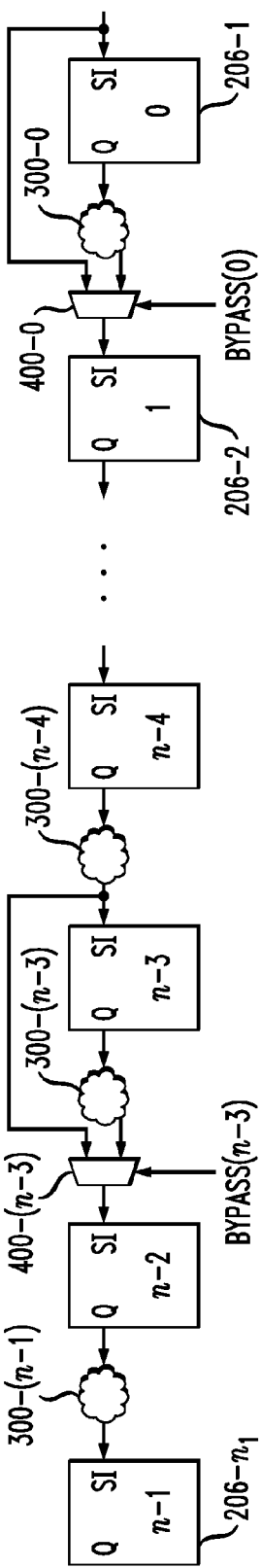

The multiplexing circuitry illustrated in the embodiment of FIG. 4 allows multiple scan cells and associated marginal timing paths to be selectively bypassed at the same time without breaking the integrity of the scan chain, thereby avoiding known or suspected delay defects. When there are no known or suspected delay defects, the scan chain 204-1 may be operated normally such that each multiplexer passes the scan output of its corresponding scan cell to the scan input of the next scan cell in the chain. However, when a delay defect is detected or suspected, the multiplexer arranged to bypass that delay defect may instead be configured to pass the scan input of its corresponding scan cell to the scan input of the next scan cell in the chain, thereby bypassing the delay defect.

The term "delay defect" as used herein is intended to be broadly construed, so as to encompass, by way of example, a suspected delay defect based at least in part on timing analysis of the type described above, or an actual delay defect detected through use of test patterns or other techniques. A delay defect may therefore be indicated in a given embodiment by a violation of a specified timing slack, as reflected in a timing slack below a designated threshold value. Moreover, bypassing of a given scan cell "responsive to" a delay defect should not be construed as requiring the detection of an actual delay defect. For example, such bypassing may be responsive to a suspected delay defect based on the corresponding timing path having a timing slack below a designated threshold value. The term "responsive to" as used herein is therefore also intended to be broadly construed.

It should be noted that if a given timing path 300 to be bypassed comprises a lockup latch, as it generally would if that path were associated with a crossing from one clock domain to another within the scan chain, an additional lockup latch should be inserted immediately following the bypass multiplexer for that path. This is to ensure that proper clock domain crossings are maintained within the scan chain when the timing path containing the lockup latch is bypassed.

Figure 5:
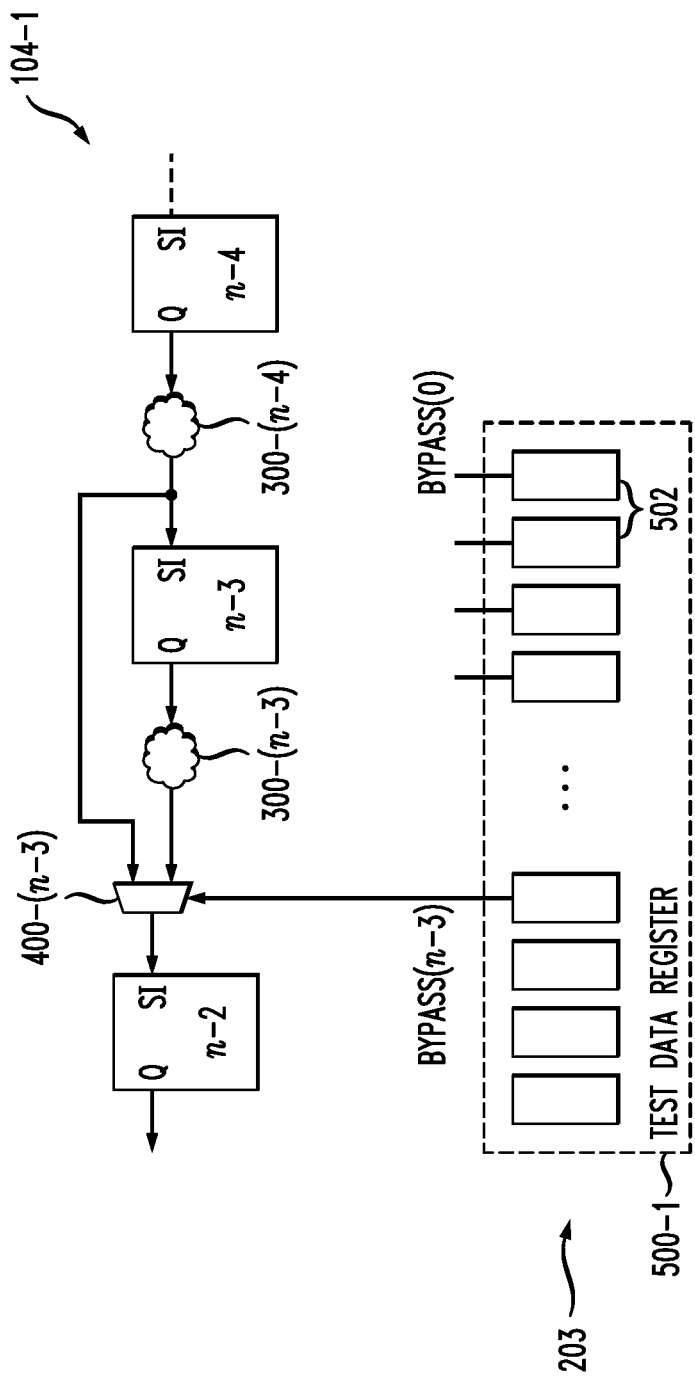
FIG. 5 shows a portion of the scan chain of FIG. 4 and a corresponding delay defect bypass controller comprising a test data register.

FIG. 5 illustrates one possible embodiment of the delay defect bypass controller 203. In this embodiment, the delay defect bypass controller 203 comprises a test data register 500-1 associated with scan chain 204-1. There may be K such test data registers, each associated with a corresponding one of the scan chains 204, if each of the K scan chains is configured for selective bypassing of scan cells. The test data register 500-1 comprises a plurality of storage elements 502 each configured to store one or more bypass control bits for controlling the select state of a corresponding one of the multiplexers 400. For example, a single bit stored in one of the storage elements 502 may be used as a bypass control signal to control the select state of a corresponding one of the two-to-one multiplexers of FIG. 4, although other types of bypass control signals may be used in other embodiments, depending on the particular configuration of the multiplexing circuitry. The single bit control logic may be configured such that if the bit is a 0, the corresponding scan cell is not bypassed, but if the bit is a 1, the corresponding scan cell is bypassed.

The test data register 500-1 can be programmed with bypass control bits by the tester 102 or another system element in order to bypass actual or potential delay defects identified in the integrated circuit 104. It should be noted that more storage elements 502 are included in the test data register 500-1 than are needed for the exemplary bypass control signals that are utilized in this particular embodiment. The test data register may therefore be sized to accommodate a maximum number of multiplexers that may be utilized in a given one of the scan chains. Of course, numerous other test data register arrangements, or more generally delay defect bypass controllers, may be used in other embodiments.

Figure 6:
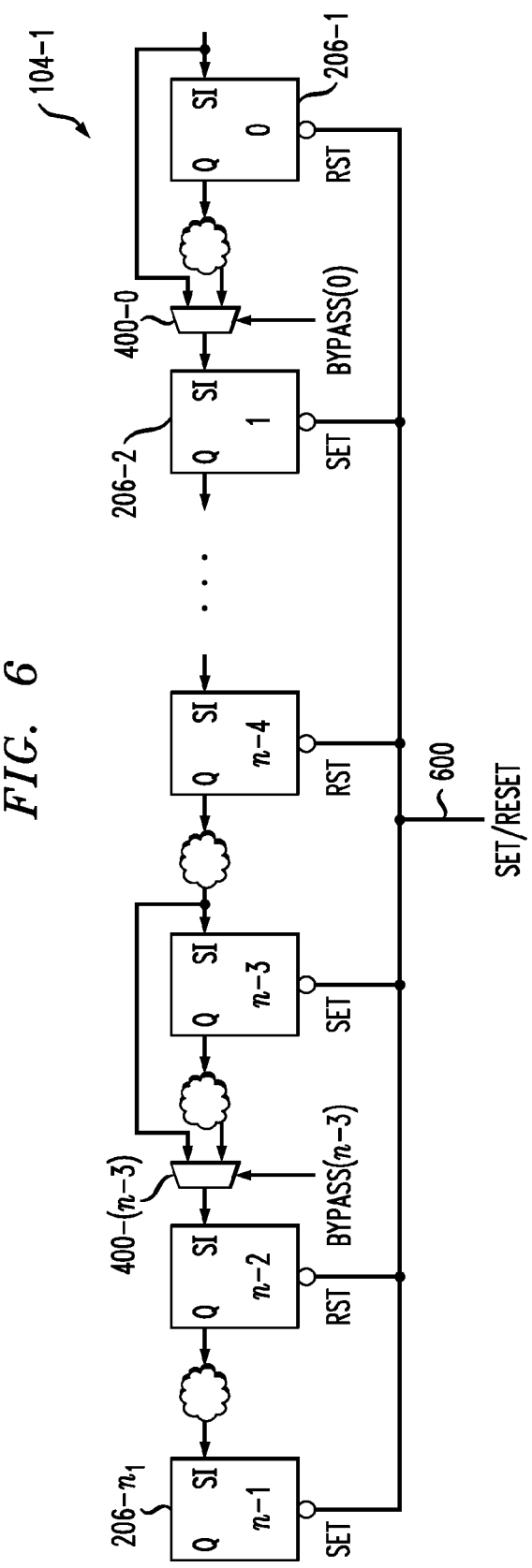
FIG. 6 shows a configuration of the FIG. 4 scan chain with alternating resettable and settable flip-flops.

In order to identify the location of scan delay defects, the scan chain 204-1 may be further configured in the manner illustrated in FIG. 6, so as to include alternating resettable and settable flip-flops. Thus, in this embodiment, the flip-flops associated with scan cells 206 of scan chain 204-1 alternate from a resettable flip-flop in scan cell 0, to a settable flip-flop in scan cell 1, to a resettable flip-flop in scan cell 2, and so on with the same alternating pattern continuing for the remaining scan cells of the chain. Other alternating patterns may be used, such as an alternating pattern in which the first flip-flop is a settable flip-flop rather than a resettable flip-flop as shown in FIG. 6.

In one possible implementation of the FIG. 6 arrangement, the resettable flip-flops are not settable, and the settable flip-flops are not resettable. This simplifies the flip-flop circuitry utilized in the scan chains 204 and thereby conserves integrated circuit area and reduces power consumption.

The reset inputs RST of the resettable flip-flops and the set inputs SET of the settable flip-flops are all coupled to a common control signal line 600. Upon assertion of the common control signal line 600, a test pattern comprising a predetermined alternating sequence of logic 1 and logic 0 values is automatically loaded into the scan cells of the scan chain. This test pattern can be used to determine the location of scan delay defects within the scan chain. More particularly, the test pattern may be shifted out of the scan chain and compared to the expected alternating sequence of logic 1 and logic 0 values. If the pattern that is shifted out matches the expected pattern, then it may be assumed that there are no actual delay defects in the scan chain. On the other hand, if the pattern that is shifted out has a consecutive string of logic 1 or logic 0 values, then it may be determined that there is an actual delay defect between the scan cells that correspond to the second consecutive 0 or 1 value.

For example, consider an embodiment comprising a scan chain with four flip-flops FF1, FF2, FF3 and FF4, and in which during a scan shift mode of operation, an applied pattern moves from a primary input pin of the integrated circuit to FF1, then from FF1 to FF2, then from FF2 to FF3, then from FF3 to FF4 and then out to a primary output pin of the integrated circuit. Further assume that the flip-flops are alternating settable and resettable flip-flops, such that an initial pattern comprising the bit sequence 1010 can be automatically loaded into the respective flip-flops FF1, FF2, FF3 and FF4 via assertion of a common control line in a manner similar to that illustrated in FIG. 6. Also, an alternating sequence 0101 . . . may be applied to the scan input of the first flip-flop FF1 of the scan chain. As these patterns are shifted out during the scan shift mode of operation, the location of a particular delay defect may be determined based on the output as follows:

Pattern out=01010; No delay defects observed
Pattern out=00000; Delay defect between FF4 and FF3
Pattern out=11110; Delay defect between FF3 and FF2
Pattern out=00010; Delay defect between FF2 and FF1

In each of the above delay defect cases, the delay defect can be bypassed using an associated multiplexer in the manner previously described. The expected output assuming that the delay defect is bypassed in each case would then be as follows:

Pattern out=10100; Delay defect between FF4 and FF3 bypassed.

Pattern out=10110; Delay defect between FF3 and FF2 bypassed.

Pattern out=10010; Delay defect between FF2 and FF1 bypassed.

These bypass settings may be stored in a test data register such as that described in conjunction with FIG. 5 for use in subsequent scan testing of the integrated circuit.

After a given delay defect is bypassed, a pattern examination process similar to that described above may be repeated in order to determine the location of any additional delay defect in the scan chain.

The scan delay defect bypass circuitry as described in conjunction with the embodiments of FIGS. 4, 5 and 6 allows scan cells and portions of their respective timing paths to be selectively bypassed in a manner that can ensure proper scan shift operation of a scan chain even in the presence of delay defects. The scan delay defect bypass circuitry is applicable for use in both compressed and noncompressed scan testing environments.

It is to be appreciated that the particular arrangements shown in FIGS. 4, 5 and 6 are presented by way of illustrative example only, and numerous alternative arrangements of scan delay defect bypass circuitry may be used to provide an ability to selectively bypass scan cells associated with marginal timing paths in the manner disclosed herein. This scan delay defect bypass functionality can be implemented in one or more of the illustrative embodiments without any significant negative impact on integrated circuit area requirements or functional timing requirements.

The presence of scan delay defect bypass circuitry as described above in conjunction with FIGS. 4, 5 and 6 within integrated circuit 104 may be made apparent to a test generation tool so that the tool can take the scan delay defect bypass functionality into account in generating test patterns. In order to accomplish this, one or more input files describing the operation of this circuitry may be provided to the test generation tool.

As one example of an implementation of scan chain circuitry in an illustrative embodiment, a given integrated circuit design may comprise 21 scan chains having a total of 193,473 timing paths between adjacent scan cells. In this design, a timing slack threshold of 20 ps was used to identify 491 of the paths that were at significant risk of a delay defect. Out of these 491 paths, there was a set of 3 consecutive paths at risk of a delay defect and a set of 2 consecutive paths at risk of a delay defect. Thus, 491−2−1=488 two-to-one multiplexers were inserted into the design in order to allow selective bypassing of any delay defects that might arise in these marginal timing paths after manufacture. The subtraction by 2 corresponds to the set of 3 consecutive marginal timing paths which can be collectively bypassed using a single multiplexer. Similarly, the subtraction by 1 corresponds to the set of 2 consecutive marginal timing paths which can be collectively bypassed using a single multiplexer. The delay defect bypass overhead in this example is thus only about 488/193,473 or 0.25%.

After the delay defect bypass multiplexers have been inserted into the design, the paths may be timed again to ensure that there are no paths with a timing slack below the 20 ps threshold. Thus, the new paths taking into account the addition of the multiplexer to the path delay may also be subject to timing analysis, so as to ensure that these new paths are at or above the threshold value.

It should be understood that this design example is presented for illustration only, and numerous alternative implementations are possible.

Scan delay defect bypass circuitry in one or more of the above embodiments can provide a significant improvement in integrated circuit device yield and diagnostic accuracy by allowing scan chains to remain operational for scan shift in the presence of multiple delay defects. This approach takes advantage of design information from timing analysis to identify timing paths that are at risk of delay defects, and can bypass such paths in the event of an actual detected delay defect, or in anticipation of such a delay defect.

Figure 7:
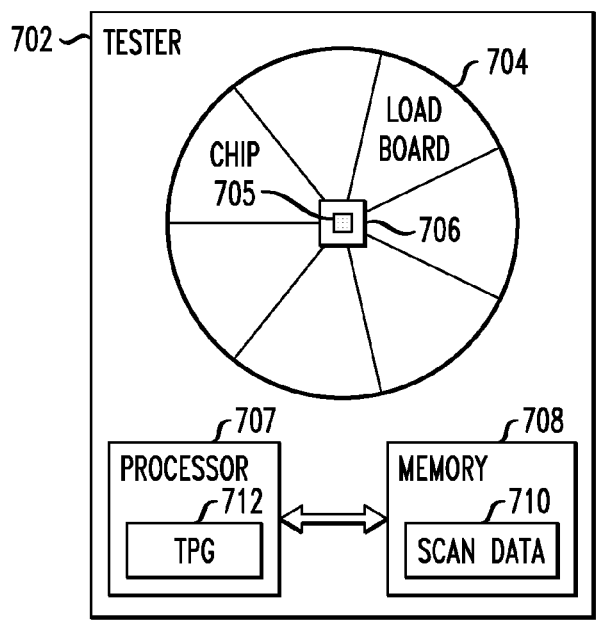
FIG. 7 shows one possible implementation of the testing system of FIG. 1.

The tester 102 in the testing system 100 of FIG. 1 need not take any particular form, and various conventional testing system arrangements can be modified in a straightforward manner to support the scan delay defect bypass functionality disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored program code. In the present embodiment, processor 707 is shown as implementing a test pattern generator 712. Associated scan data 710 is stored in memory 708. Numerous alternative testers may be used to perform scan testing of an integrated circuit as disclosed herein. Also, as indicated previously, in alternative embodiments at least portions of the tester 702 may be incorporated into the integrated circuit itself, as in BIST arrangement.

Figure 8:
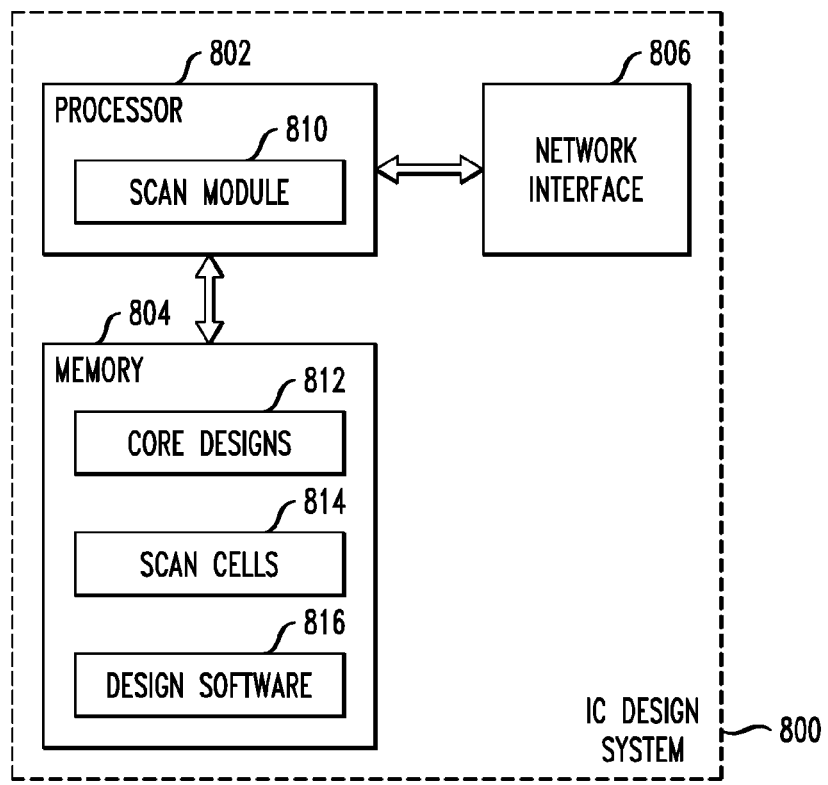
FIG. 8 is a block diagram of a processing system for generating an integrated circuit design comprising scan delay defect bypass circuitry of the type illustrated in FIGS. 4, 5 and 6.

The insertion of scan cells to form scan chains having associated scan delay defect bypass functionality in scan test circuitry of an integrated circuit design may be performed in a processing system 800 of the type shown in FIG. 8. Such a processing system in this embodiment more particularly comprises a design system configured for use in designing integrated circuits such as integrated circuit 104 to include scan test circuitry 106 having scan delay defect bypass circuitry comprising multiplexers 400 and possibly at least a portion of delay defect bypass controller 203.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated scan delay defect bypass circuitry in the manner disclosed herein, in conjunction with utilization of integrated circuit design software 816.

By way of example, the scan chain circuitry 106 comprising scan chains 204 and associated scan delay defect bypass circuitry may be generated in system 800 using an RTL description and then synthesized to gate level using a specified technology library. A test generation model may then be created for generating test patterns using a test generation tool. Control files or other types of input files may be used to provide the test generation tool with information such as the particular scan cells of each scan chain that are configured for selective bypassing in a given embodiment. Once the corresponding rules are in place, a rule checker may be run so that the test generation tool has visibility of the scan chains taking into account the operation of the scan delay defect bypass circuitry. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan chain and scan delay defect bypass functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the embodiments of the invention as described herein are intended to be illustrative only. For example, other embodiments of the invention can be implemented using a wide variety of other types of scan test circuitry, with different types and arrangements of scan delay defect bypass circuitry, associated bypass controllers and other elements, as well as different types and arrangements of bypass control signaling and scan test pattern generation, than those included in the embodiments described herein. These and numerous other alternative embodiments within the scope of the following claims will be readily apparent to those skilled in the art.

What is claimed is:

1. An integrated circuit comprising:
    scan test circuitry; and
    additional circuitry subject to testing utilizing the scan test circuitry;
    the scan test circuitry comprising at least one scan chain having a plurality of scan cells;
    the scan test circuitry further comprising scan delay defect bypass circuitry comprising a plurality of multiplexers arranged within said at least one scan chain with at least a given one of the multiplexers being configured to allow a corresponding one of the scan cells to be selectively bypassed in a scan shift mode of operation responsive to a delay defect associated with that scan cell.

2. The integrated circuit of claim 1 wherein in the scan shift mode of operation the scan cells of the scan chain form a serial shift register operative to receive an applied test pattern.

3. The integrated circuit of claim 1 wherein select states of the respective multiplexers are controlled by a delay defect bypass controller.

4. The integrated circuit of claim 3 wherein the delay defect bypass controller is implemented at least in part within the scan delay defect bypass circuitry of the scan test circuitry.

5. The integrated circuit of claim 4 wherein the delay defect bypass controller comprises a test data register configured to store at least one bypass control bit for each of the plurality of multiplexers.

6. The integrated circuit of claim 1 wherein the plurality of multiplexers comprises a plurality of two-to-one multiplexers.

7. The integrated circuit of claim 1 wherein the given multiplexer comprises:
    a first input coupled to a scan input of the corresponding one of the scan cells to be selectively bypassed;
    a second input coupled to a scan output of the corresponding one of the scan cells to be selectively bypassed;
    an output coupled to a scan input of a subsequent scan cell of the scan chain; and
    a select line adapted for receiving a bypass control signal for controlling the multiplexer between at least a first state in which the corresponding scan cell is not bypassed and a second state in which the corresponding scan cell is bypassed.

8. The integrated circuit of claim 7 wherein the bypass control signal is generated by a delay defect bypass controller.

9. The integrated circuit of claim 1 wherein the scan cells of the scan chain comprise respective alternating resettable and settable flip-flops.

10. The integrated circuit of claim 9 wherein a first one of the scan cells of the scan chain comprises a resettable flip-flop, a second one of the scan cells comprises a settable flip-flop, and a third one of the scan cells comprises a resettable flip-flop, with that alternating pattern continuing for the remainder of the scan chain.

11. The integrated circuit of claim 9 wherein reset inputs of the resettable flip-flops and set inputs of the settable flip-flops are each coupled to a common control signal line such that upon assertion of that common control signal line a test pattern comprising a predetermined alternating sequence of logic 1 and logic 0 values is automatically loaded into the scan cells of the scan chain.

12. The integrated circuit of claim 1 wherein the multiplexers are inserted in locations in the scan chain that are determined by performing a timing analysis on timing paths between respective pairs of the scan cells.

13. The integrated circuit of claim 1 wherein the multiplexers are inserted in the scan chain so as to permit selective bypass of only those scan cells having respective associated timing paths with timing slacks below a specified threshold value.

14. A disk drive controller comprising the integrated circuit of claim 1.

15. A method comprising:
    configuring at least one scan chain to include a plurality of scan cells; and
    bypassing at least a selected one of the scan cells of the scan chain in a scan shift mode of operation responsive to a delay defect associated with that scan cell.

16. The method of claim 15 wherein the step of bypassing at least a selected one of the scan cells comprises bypassing one or more of the scan cells in accordance with logic levels of respective bypass control bits stored for those scan cells in a test data register.

17. The method of claim 15 wherein the step of bypassing at least a selected one of the scan cells comprises applying a bypass control signal to a select line of a multiplexer arranged in a timing path associated with the selected scan cell to control the multiplexer between at least a first state in which the corresponding scan cell is not bypassed and a second state in which the corresponding scan cell is bypassed.

18. The method of claim 15 further comprising the steps of:
    applying a test pattern to the scan cells of the scan chain in the scan shift mode of operation;
    determining a location of a delay defect based on the test pattern; and
    bypassing the scan cell associated with the location of the delay defect.

19. A computer program product comprising a non-transitory computer-readable storage medium having computer program code embodied therein for use in scan testing an integrated circuit, wherein the computer program code when executed in a testing system causes the testing system to perform the steps of the method of claim 15.

20. A processing system comprising:
- a processor; and
- a memory coupled to the processor and configured to store information characterizing an integrated circuit design;
- wherein the processing system is configured to provide scan test circuitry within the integrated circuit design, the scan test circuitry comprising at least one scan chain having a plurality of scan cells;
- the scan test circuitry further comprising scan delay defect bypass circuitry comprising a plurality of multiplexers arranged within said at least one scan chain with at least a given one of the multiplexers being configured to allow a corresponding one of the scan cells to be selectively bypassed in a scan shift mode of operation responsive to a delay defect associated with that scan cell.

* * * * *